(12) United States Patent
Aipperspach et al.

(10) Patent No.: US 6,181,614 B1
(45) Date of Patent: Jan. 30, 2001

(54) DYNAMIC REPAIR OF REDUNDANT MEMORY ARRAY

(75) Inventors: Anthony Gus Aipperspach; Charles Porter Geer, both of Rochester, MN (US)

(73) Assignee: International Business Machines Corporation, Armonk, NY (US)

(*) Notice: Under 35 U.S.C. 154(b), the term of this patent shall be extended for 0 days.

(21) Appl. No.: 09/439,974

(22) Filed: Nov. 12, 1999

(51) Int. Cl.$^7$ .................................................. G11C 7/00
(52) U.S. Cl. ...................... 365/200; 365/225.7; 365/201; 714/6; 714/7; 714/710; 714/718; 714/733
(58) Field of Search ................... 365/200, 225.7, 365/201; 714/6, 7, 710, 718, 733

(56) References Cited

U.S. PATENT DOCUMENTS

| | | | |
|---|---|---|---|
| 4,722,084 | * | 1/1988 | Morton ...................................... 371/9 |
| 4,876,685 | | 10/1989 | Rich ...................................... 371/21.6 |
| 5,255,227 | | 10/1993 | Haeffele ................................ 365/200 |
| 5,270,974 | | 12/1993 | Reddy .................................... 365/200 |
| 5,598,373 | | 1/1997 | Wada et al. ....................... 365/230.03 |
| 5,764,577 | | 6/1998 | Johnston et al. ..................... 365/200 |
| 5,764,878 | * | 6/1998 | Kablanian et al. .............. 395/182.05 |
| 5,970,000 | * | 10/1999 | Kirihata et al. ..................... 365/200 |
| 6,006,311 | * | 12/1999 | Arimilli et al. ...................... 711/133 |
| 6,065,134 | * | 5/2000 | Bair et al. ................................ 714/7 |
| 6,081,910 | * | 6/2000 | Mifsud et al. ........................ 714/718 |

OTHER PUBLICATIONS

Naritake, Isao et al., WP 24.6: A 12ns 8MB DRAM Secondary Cache for a 64b Microprocessor, *Digest of Technical Papers*, 1999 IEEE International Solid–State Circuits Conference, Session 24, IEEE, (Feb. 17, 1999) 0–7803–5126–6/99, pp. 420–421.

Naritake, Isao et al., WP 24.6: A 12ns 8MB DRAM Secondary Cache for a 64b Microprocessor, *1999 ISSCC Slide Supplement*, Session 24/DRAM/Paper WP 24.6, IEEE (1999), pp. 358–359.

Kim, Ilyoung et al., "Built In Self Repair for Embedded High Density SRAM", *International Test Conference*, Paper 43.2, 0–7803–5092–8/98, IEEE (1998), pp. 1112–1119.

* cited by examiner

Primary Examiner—Viet Q. Nguyen
(74) Attorney, Agent, or Firm—Scott A. Stinebruner; Wood, Herron & Evans

(57) ABSTRACT

A circuit arrangement and method of dynamically repairing a redundant memory array utilize dynamically-determined repair information, generated from a memory test performed on the redundant memory array, along with persistently-stored repair information to repair the redundant memory array. In one implementation, for example, the persistent repair information is generated during manufacture to repair manufacturing defects in the array, with the dynamic repair information generated during a power-on reset of the array to address any additional faults arising after initial manufacture and repair of the array. Furthermore, repair of dynamically-determined errors may utilize otherwise unused redundant memory cells in a redundant memory array, thus minimizing the additional circuitry required to implement dynamic repair functionality with an array.

22 Claims, 3 Drawing Sheets

DYNAMIC REPAIR OF REDUNDANT MEMORY ARRAY

FIELD OF THE INVENTION

The invention is generally related to data storage in data processing systems and the like, and in particular, to the repair of faulty memory cells in solid state memory arrays.

BACKGROUND OF THE INVENTION

Solid state memory arrays are frequently used in computers and other electronic devices where fast access times are desired. For example, solid state memory arrays are often used as the main working storage repository for a computer, as well as in higher speed cache memories, implemented either separate from or in the same integrated circuit device as the principal processing circuitry for the computer.

Solid state memory arrays are typically implemented on a semiconductor integrated circuit device using multiple memory "cells" assigned to different memory addresses and arranged together with support circuitry suitable for accessing specific memory cells in the array. Due to processing variations that are inherent in all semiconductor manufacturing processes, it is not uncommon for one or more memory cells in a manufactured memory array to be faulty, and thus be incapable of reliably storing information. While a memory array may contain thousands or millions of memory cells, if even one memory cell in the memory array is faulty, the entire memory array is essentially unusable.

To address this concern, a portion of the memory cells in many memory array designs are designated as "redundant" memory cells that are selectively used to repair the memory arrays whenever primary memory cells are found to be faulty. Typically, such repairs are made by selectively activating "fuses" disposed on the same integrated circuit device as a memory array. Often, a fuse is implemented as an conductive interconnect that is selectively (and permanently) broken using a laser or an excessive electrical current. The fuse is coupled to routing logic for the memory array, such that, when the fuse conducts, a primary memory cell, or bank of primary memory cells, are accessed whenever a specific memory address associated with such a cell is requested. However, whenever the fuse is broken, the routing logic will instead access a redundant memory cell, or bank of redundant memory cells, in place of the primary memory cell(s) associated with that memory address.

Through the use of redundant memory cells, the manufacturing yield of semiconductor devices incorporating memory arrays can be significantly improved, since memory arrays containing relatively minor faults can be repaired, rather than having to be completely scrapped. Particularly when a memory array is integrated onto the same integrated circuit device as a complex and expensive logic circuit (e.g., as a level one cache for use with a microprocessor core), the cost savings associated with fuse-based repairs can be substantial.

However, even after manufacture and repair, memory arrays are capable of failure in the field, most often due to single bit errors resulting from the failure of single memory cells. To address this concern, ABIST logic is often utilized to detect additional faulty memory cells in a memory array, typically during initialization of the memory array (e.g., during power-on reset of an integrated circuit device within which the memory array is implemented). Whenever a memory cell is determined to be faulty, the memory address associated with that memory cell is marked as "bad" and not used. In some instances, simply marking a memory location as bad is sufficient until the integrated circuit device can be replaced by service personnel. In other instances, however, the computer may crash, and thus be unusable until the failed device can be replaced. Particularly in multi-user and fault-tolerant computer systems where accessibility is a paramount concern, computer crashes are extremely costly and highly undesirable.

As a result, a significant need continues to exist in the art for an improved manner of addressing memory array failures in the field.

SUMMARY OF THE INVENTION

The invention addresses these and other problems associated with the prior art by providing a circuit arrangement and method of dynamically repairing a redundant memory array in which dynamically-determined repair information, generated from a memory test performed on the redundant memory array, is utilized along with persistently-stored repair information to repair the redundant memory array. Specifically, persistent repair information (stored, for example, in fuses and/or other non-volatile storage) is retrieved, and a memory test is initiated on the redundant memory array to generate dynamic repair information associated with the redundant memory array. Both the persistent repair information, and the dynamic repair information, are then used to dynamically repair the redundant memory array.

While the invention may be utilized in a wide variety of other applications, one particularly beneficial application of the invention may be in dynamically repairing a redundant memory array during array initialization to automatically repair the array in the field. In such an implementation, the persistent repair information may be generated during manufacture to repair manufacturing defects in the array, with the dynamic repair information generated during a power-on reset to address any additional faults arising after initial manufacture and repair of the array. Typically, but not exclusively, the testing of the redundant memory array in such an implementation occurs after any faults identified by the persistent repair information are repaired, such that additional faults can be detected separate from any manufacturing faults. As a consequence, the occurrence of relatively minor faults after manufacture of an array may be repaired, rather than requiring replacement of the array in the field, potentially resulting in fewer service calls and greater reliability.

Moreover, while other manners of dynamically repairing a redundant memory array may be used consistent with the invention, one particularly beneficial implementation utilizes redundant memory cells in the memory array that would be otherwise unused after repair during manufacture. As such, additional memory cells above and beyond those required to ensure suitable manufacturing yields would typically not be required to implement dynamic repair consistent with the invention.

These and other advantages and features, which characterize the invention, are set forth in the claims annexed hereto and forming a further part hereof. However, for a better understanding of the invention, and of the advantages and objectives attained through its use, reference should be made to the Drawings, and to the accompanying descriptive matter, in which there is described exemplary embodiments of the invention.

DETAILED DESCRIPTION

Figure 1:
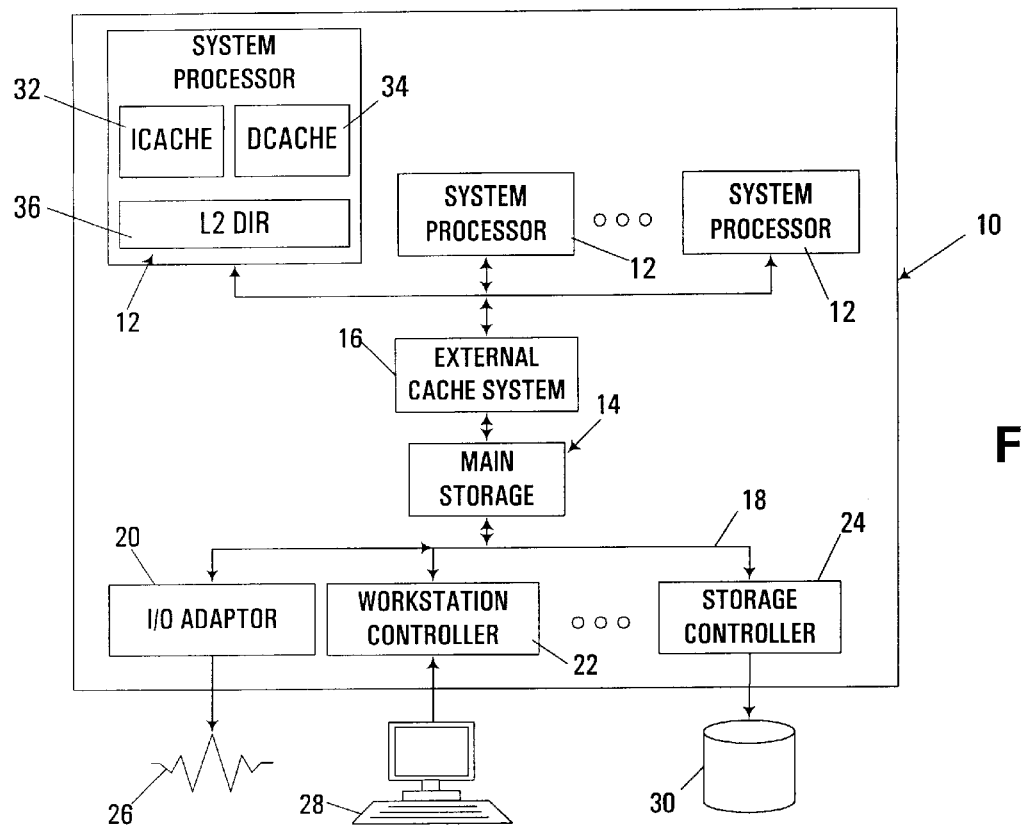
FIG. 1 is a block diagram of a data processing system consistent with the invention.

Turning to the Drawings, wherein like numbers denote like parts throughout the several views, FIG. 1 illustrates the general configuration of an exemplary data processing system 10 suitable for implementing a dynamically-repairable redundant memory array circuit arrangement consistent with the invention. System 10 generically represents, for example, any of a number of multi-user computer systems such as a network server, a midrange computer, a mainframe computer, etc. However, it should be appreciated that the invention may be implemented in other data processing systems, e.g., in stand-alone or single-user computer systems such as workstations, desktop computers, portable computers, and the like, or in other programmable electronic devices (e.g., incorporating embedded controllers and the like). One suitable implementation of data processing system 10 is in a midrange computer such as the AS/400 computer available from International Business Machines Corporation.

Data processing system 10 generally includes one or more system processors 12 coupled to a memory subsystem including main storage 14 and an external cache system 16. Furthermore, main storage 14 is coupled to a number of types of external devices via a system input/output (I/O) bus 18 and a plurality of interface devices, e.g., an input/output adaptor 20, a workstation controller 22 and a storage controller 24, which respectively provide external access to one or more external networks 26, one or more workstations 28, and/or one or more storage devices such as a direct access storage device (DASD) 30.

Dynamic redundant memory array repair consistent with the invention is typically implemented in connection with a redundant memory array implemented using solid state memory cells, e.g., as are commonly found in dynamic random access memories (DRAM's), static random access memories (SRAM's), content addressable memories (CAM's), and the like. For example, for data processing system 10, it is contemplated that dynamic redundant memory array repair may be implemented in connection with a redundant memory array disposed in one of the system processors 12 (e.g., within any or all of a level one instruction cache 32, a level one data cache 34, or a directory array 36 for an external level two cache), main storage 14, external cache system 16, or in any working arrays utilized in any of the adaptors, controllers or external devices interfaced into data processing system 10. The invention may also have utility in practically any electronic application capable of utilizing a redundant memory array. Therefore, the invention is not limited to the particular implementations discussed herein.

Dynamic redundant memory array repair consistent with the invention is typically implemented in a circuit arrangement disposed on one or more integrated circuit devices, either integrated onto the same integrated circuit device as an associated redundant memory array or disposed on a separate integrated circuit device electrically coupled thereto. Moreover, as is well known in the art, integrated circuit devices are typically designed and fabricated using one or more computer data files, referred to herein as hardware definition programs, that define the layout of the circuit arrangements on the devices. The programs are typically generated by a design tool and are subsequently used during manufacturing to create the layout masks that define the circuit arrangements applied to a semiconductor wafer. Typically, the programs are provided in a predefined format using a hardware definition language (HDL) such as VHDL, verilog, EDIF, etc. While the invention has and hereinafter will be described in the context of circuit arrangements implemented in fully functioning integrated circuit devices and electronic devices and data processing systems utilizing such devices, those skilled in the art will appreciate that circuit arrangements consistent with the invention are capable of being distributed as program products in a variety of forms, and that the invention applies equally regardless of the particular type of signal bearing media used to actually carry out the distribution. Examples of signal bearing media include but are not limited to recordable type media such as volatile and non-volatile memory devices, floppy disks, hard disk drives, CD-ROM's, and DVD's, among others and transmission type media such as digital and analog communications links.

It should be appreciated that data processing system 10 is merely representative of one suitable environment for use with the invention, and that the invention may be utilized in a multitude of other environments in the alternative.

Figure 2:
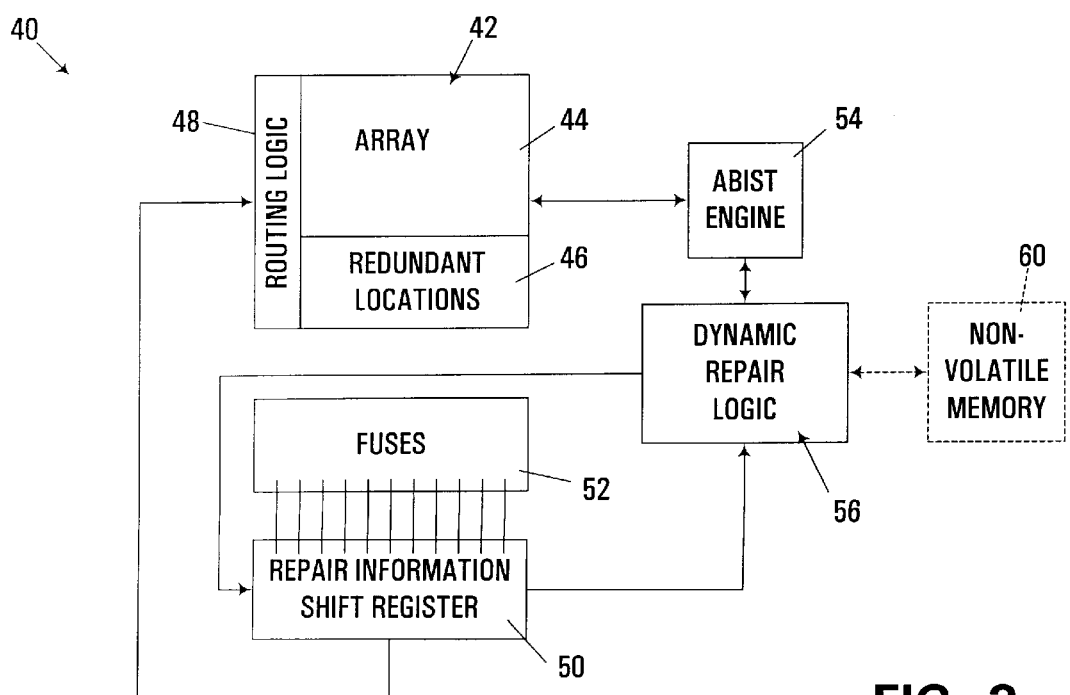
FIG. 2 is a block diagram of a dynamically-repairable redundant memory array circuit arrangement consistent with the invention.

FIG. 2 illustrates a dynamically-repairable redundant memory array circuit arrangement 40 suitable for use, for example, in any of the redundant memory arrays described above in connection with FIG. 1. For the exemplary implementation below, for example, it is assumed that circuit arrangement 40 is implemented within an 5 embedded L1 or L2 cache disposed on the same integrated circuit device as a microprocessor core, although the invention is not limited to this particular implementation.

Circuit arrangement 40 includes a redundant memory array 42 partitioned into a primary partition 44 and a redundant partition 46. Each partition 44, 46 incorporates a plurality of solid state memory cells, with primary partition 44 incorporating a significantly larger number of primary memory cells than the number of redundant memory cells in redundant partition 46. For example, redundant memory sub-array may be implemented as a 16 KB memory, having 256 576-bit wide rows, whereby primary partition 44 incorporates 144 K memory cells. In this implementation, faults are detected and repairs are made on a row-by-row basis. As such, redundant partition is implemented with 1152 memory cells, thereby providing enough redundant storage to selectively repair up to two rows in the primary partition. It will be appreciated that other relative sizes and arrangements of memory cells may be used in redundant memory array 42.

Repairs to redundant memory array 42 are implemented within routing logic 48 disposed within the redundant memory array. The routing logic incorporates decode logic that selectively routes memory access requests received over an address bus (not shown) to the specific memory cells in the array requested by the memory access request. Also incorporated within routing logic 48 is repair logic that operates concurrently with the decode logic (e.g., during the first level of decode in a three level decode arrangement) to determine whether a requested memory address is allocated to a set of memory cells in the primary partition that have been previously designated as being faulty. Such determination is made by polling repair information stored in a repair information register, here implemented as a shift register 50.

Persistent repair information for use in repairing manufacturing faults is stored in a fuse block 52 accessible by register 50. As is well known in the art, each fuse in fuse block 52 operates as persistent and read-only storage of repair information, and is selectively blown through the use of laser etching, excessive electrical current, or other manners known in the art during manufacture in response to manufacturing tests performed on the manufactured array. Typically, the manufacturing tests utilize array built-in self-testing (ABIST), implemented for example using an ABIST engine 54 interfaced with redundant memory array 42.

As discussed above, routing logic 48 is configured to selectively replace memory cells on a row-by-row basis. Put another way, detection of a fault in any memory cell allocated to a particular row results in the entire row being repaired. As such, register 50 is configured to store sufficient information for routing memory access requests directed to up to two faulty rows to redundant rows in redundant partition 46. For the arrangement of memory cells discussed above, register 50 may be implemented using 18 bits, with 9 bits allocated to each redundant row. Within each 9 bit entry, one bit may be used as a master select bit to indicate that the redundant row is being used, and the other 8 bits to identify which of 256 rows should be replaced by the redundant row.

It will be appreciated that selective routing of memory access requests between primary and redundant partitions of a redundant memory array in response to fuse information, as well as the performance of memory tests such as ABIST, are well known in the art, and thus need not be discussed in greater detail herein. Furthermore, it will be appreciated that other manners of repairing a redundant memory array may be utilized in the alternative. For example, rather than repairing faults on a row-by-row basis, other granularities may be used, e.g., bytes or words, columns, subarrays, cache lines, etc., as appropriate for the particular organization of the subarray and/or the memory within which the subarray is used. Moreover, a greater number of redundant locations may be provided to support a greater number of repairs. In addition, a wide variety of known memory test algorithms may be used to identify faults in a redundant memory array. Other modifications will be apparent to one of ordinary skill in the art.

Dynamic repair of redundant memory array 42 is implemented using dynamic repair logic 56. Logic 56 may be implemented in a number of manners, e.g., within ABIST engine 54, within a logic circuit disposed on the same integrated circuit device as redundant memory array 42, or within a separate, external integrated circuit device electrically coupled to the array. The functionality implemented within dynamic repair logic 56 may be imparted using a hardwired state machine, or may be imparted using software executing on a more general purpose processing core. As one example, dynamic repair logic 56 may be implemented in a service processor interfaced with the system processor integrated circuit device within which the redundant memory array is incorporated. Furthermore, the dynamic repair logic may be dedicated to a specific redundant memory array, or may be configured to test and repair multiple memory arrays. Other implementations will be apparent to one of ordinary skill in the art.

Dynamic repair logic 56 is coupled to ABIST engine 54 to initiate a memory test in the ABIST engine, as well as to receive fault information from the engine representing which, if any, rows are determined to be faulty in the redundant memory array. When the ABIST engine outputs the fault information to the dynamic repair logic in response to a memory test performed during initialization of the array, the fault information functions as dynamic repair information.

Dynamic repair logic 56 is also coupled to register 50 through a pair of serial interconnects, such that the contents of register 50 can be scanned out to the dynamic repair logic through a sequence of shift operations, and new contents can be scanned into the register 50 in a like manner. In the alternative, a parallel connection between register 50 and dynamic repair logic 56 may be used.

As discussed above, fuse block 52 functions as persistent storage for storing persistent repair information. As illustrated by block 60, however, additional non-volatile memory may optionally be coupled to dynamic repair logic 56 such that dynamic repair information may also be persistently stored for future initialization operations. Block 60 may be implemented using any form of rewritable non-volatile storage, e.g., a flash memory array, mass storage, networked storage, etc. In other embodiments, block 60 may be utilized in lieu of a fuse block.

Figure 3:
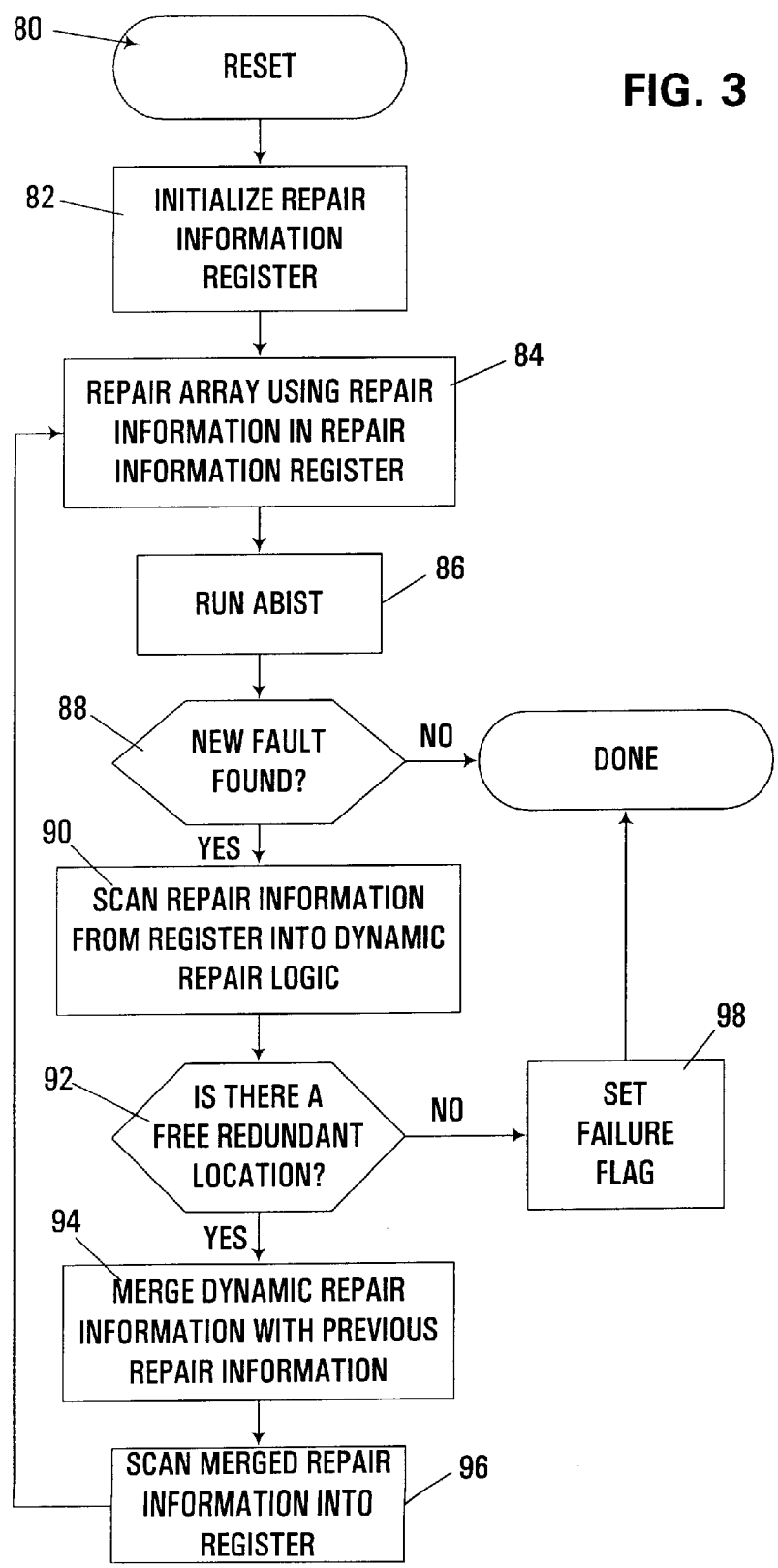
FIG. 3 is a flowchart illustrating the sequence of operations performed by the circuit arrangement of FIG. 2 in response to a power-on reset.

FIG. 3 next illustrates an exemplary sequence of operations performed by circuit arrangement 40 of FIG. 2 during initialization of the redundant memory array. In this sequence of operations, a separate non-volatile memory block is not used.

As shown in FIG. 3, the sequence of operations is implemented as a reset routine 80, initiated, for example, in response to a power-on reset performed either at power up or as a result of a soft reset. Such a routine may be executed, for example, during the initial program load (IPL) of a data processing system.

Routine 80 begins in block 82 by initializing repair information register 50 with the fuse (or persistent repair) information stored in fuse block 52, e.g., by initiating a latch of the fuse block by register 50. Next, in block 84, the redundant array is repaired using the fuse information, e.g., through permitting routing logic 48 to access the register 50, in a manner known in the art. Next, ABIST is initiated in block 86, typically by sending an initiate signal to ABIST engine 54. Next, block 88 determines whether any new faults were found, typically by analyzing the dynamic repair information returned by ABIST engine 54. If not, no additional repairs need be performed, and routine 80 is complete.

Otherwise, control passes to block 90 to scan the previous repair information stored in the repair information register into the dynamic repair logic. Block 92 next determines whether a free redundant location exists in the redundant memory array, typically by polling the master select bits in register 50 for an unselected register entry. If a free location exists, control passes to block 94 to merge the dynamic repair information with the previous repair information, thereby adding a new entry identifying the additional faulty row indicated by ABIST engine 54. Block 96 next scans the merged repair information back into register 50, and control returns to block 84 to repair the array using the new merged repair information. As such, the dynamic repair information is thereafter utilized by the routing logic for the array to repair the additional faulty row.

Returning to block 92, if no free redundant location is available, no additional repairs can be performed. Control therefore passes to block 98 to set a failure flag to indicate that the array has failed. Routine 80 is then complete.

As shown in FIG. 3, routine 80 is configured to cycle through repeated repair operations until no additional errors are detected. In other embodiments, no additional testing may be performed, or a single ABIST operation may be performed after a repair to verify that the repair has been made.

Figure 4:
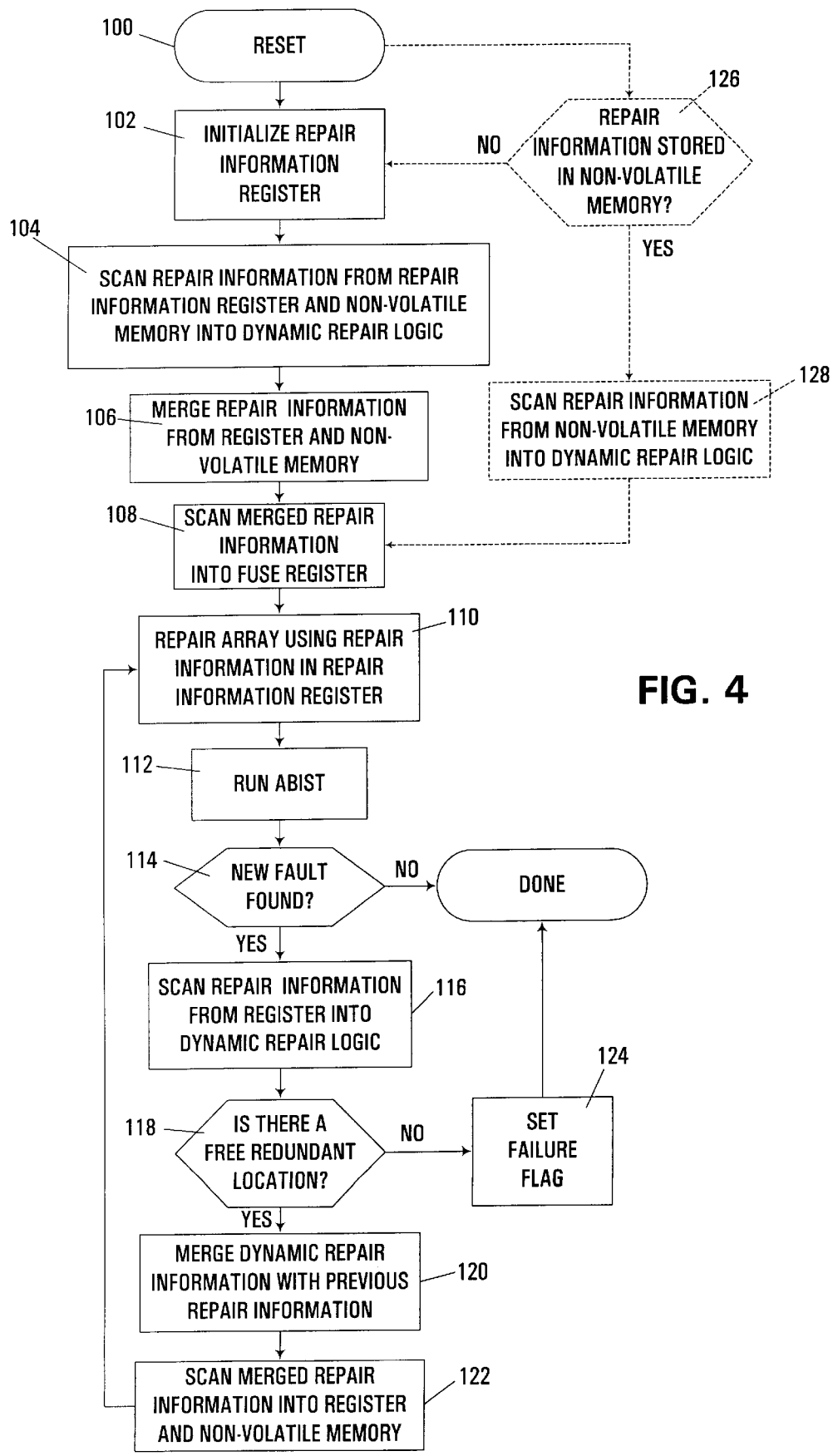
FIG. 4 is a flowchart illustrating an alternate sequence of operations to that of FIG. 3, implementing non-volatile storage of dynamic repair information.

FIG. 4 illustrates an alternate reset routine 100 that utilizes the non-volatile storage block 60 to incorporate previously generated dynamic repair information in the repair actions taken during an initialization operation. Routine 100 begins in block 102 by initializing repair information register 50 with the persistent repair information stored in fuse block 52. Next, block 104 scans the repair information stored in the repair information register and any additional repair information stored in non-volatile storage block 60 into the dynamic repair logic. Block 106 then merges the two types of persistent repair information, and block 108 scans the merged repair information into the repair information register.

Next, in block 110, the redundant array is repaired using the merged repair information, and in block 112, ABIST is initiated. Next, block 114 determines whether any new faults were found by analyzing the dynamic repair information returned by ABIST engine 54. If not, no additional repairs need be performed, and routine 100 is complete.

Otherwise, control passes to block 116 to scan the previous repair information stored in the repair information register into the dynamic repair logic. Block 118 next determines whether a free redundant location exists in the redundant memory array. If a free location exists, control passes to block 120 to merge the dynamic repair information with the previous repair information, thereby adding a new entry identifying the additional faulty row indicated by ABIST engine 54. Block 122 next scans the merged repair information back into register 50, as well as into non-volatile storage block 60. Control then returns to block 110 to repair the array using the new merged repair information. As such, the dynamic repair information is thereafter utilized by the routing logic for the array to repair the additional faulty row.

Returning to block 118, if no free redundant location is available, no additional repairs can be performed. Control therefore passes to block 124 to set a failure flag to indicate that the array has failed. Routine 100 is then complete. As above with routine 80, in other implementations ABIST may only be performed once, or not at all, after the dynamic repair information is stored in register 50.

It should be appreciated that, by storing the merged repair information in non-volatile storage block 60, the fuse information may be redundantly stored in block 60. As such, it may be desirable to utilize an alternate control path, shown beginning at block 126, rather than beginning at block 102 in response to an initialization operation. Block 126 determines whether any repair information is stored in non-volatile storage block 60, such that, if no repair information is stored, control passes to block 102 to proceed in the manner described above.

If, however, repair information is found to be stored in block 60, it may be assumed that the persistent repair information represented by the fuse block is already incorporated into the persistent repair information stored in block 60. As such, block 126 may pass control to block 128 to scan the repair information stored in block 60 into the dynamic repair logic, and then to block 108 to scan such information into register 50 directly, thereby bypassing the operations performed in blocks 102–106.

It will also be appreciated that, should fuse block 52 be omitted in an implementation, routine 100 would simply scan any repair information stored in block 60 into the dynamic repair logic, prior to running ABIST and processing any new dynamic repair information.

As such, it may be seen that repairs may be made dynamically to a redundant memory array such that both previously-stored persistent repair information and dynamically-determined repair information are reflected in the repairs made to the array. As a result, failures in the field can be reduced, reducing servicing costs and increasing reliability. Moreover, in implementations where otherwise unused redundant memory cells are used to repair an array dynamically, such dynamic repair may be implemented with little additional circuitry.

Various additional modifications may be made to the illustrated embodiments without departing from the spirit and scope of the invention. Therefore, the invention lies in the claims hereinafter appended.

What is claimed is:

1. A method of dynamically repairing a redundant memory array, the method comprising:
    (a) retrieving persistent repair information associated with a redundant memory array;
    (b) initiating a memory test on the redundant memory array to generate dynamic repair information associated with the redundant memory array; and
    (c) dynamically repairing the redundant memory array using both the persistent repair information and the dynamic repair information.

2. The method of claim 1, wherein retrieving the persistent repair information includes accessing a plurality of fuses.

3. The method of claim 1, wherein retrieving the persistent repair information includes accessing a rewritable non-volatile storage device.

4. The method of claim 1, further comprising persistently storing the dynamic repair information.

5. The method of claim 1, wherein initiating the memory test on the redundant memory array includes initiating an array built-in self test (ABIST) operation.

6. The method of claim 1, wherein dynamically repairing the redundant memory array includes configuring routing logic associated with the memory array to reroute any memory accesses associated with a faulty memory cell to a redundant memory cell.

7. The method of claim 1, further comprising repairing the redundant memory array using the persistent repair information prior to initiating the memory test.

8. The method of claim 7, wherein the redundant memory array is associated with routing logic configured to route memory accesses to the redundant memory array, the routing logic responsive to the contents of a repair information register, wherein repairing the redundant memory array using the persistent repair information prior to initiating the memory test includes storing the persistent repair information in the repair information register, and wherein dynamically repairing the redundant memory array using both the persistent repair information and the dynamic repair information includes:
    (a) retrieving the persistent repair information from the repair information register;
    (b) merging the persistent repair information with the dynamic repair information to generate merged repair information; and
    (c) storing the merged repair information in the repair information register.

9. The method of claim 7, wherein repairing the redundant memory array using the persistent repair information prior to initiating the memory test, initiating the memory test, and dynamically repairing the redundant memory array using both the persistent repair information and the dynamic repair information are performed sequentially during initialization of the redundant memory array.

10. A circuit arrangement, comprising:
(a) persistent storage configured to store persistent repair information associated with a redundant memory array; and
(b) a dynamic repair circuit coupled to the persistent storage, the dynamic repair circuit configured to initiate a memory test on a redundant memory array to generate dynamic repair information associated with such redundant memory array, and to thereafter dynamically repair such redundant memory array using both the persistent repair information and the dynamic repair information.

11. The circuit arrangement of claim 10, wherein the persistent storage comprises a plurality of fuses.

12. The circuit arrangement of claim 10, wherein the persistent storage comprises a rewritable non-volatile storage device.

13. The circuit arrangement of claim 10, wherein the dynamic repair circuit is further configured to persistently store the dynamic repair information.

14. The circuit arrangement of claim 10, further comprising an array built-in self test (ABIST) engine, wherein the dynamic repair circuit is configured to initiate the memory test using the ABIST engine.

15. The circuit arrangement of claim 10, further comprising:
(a) a redundant memory array including primary and redundant memory elements;
(b) a repair information register; and
(c) routing logic coupled to the redundant memory array and configured to selectively route memory accesses between primary and redundant memory elements in the redundant memory array responsive to the contents of the repair information register.

16. The circuit arrangement of claim 15, wherein the dynamic repair circuit is further configured to repair the redundant memory array using the persistent repair information prior to initiating the memory test.

17. The circuit arrangement of claim 16, wherein the dynamic repair circuit is configured to repair the redundant memory array using the persistent repair information prior to initiating the memory test by storing the persistent repair information in the repair information register, and to dynamically repair the redundant memory array using both the persistent repair information and the dynamic repair information by:
(a) retrieving the persistent repair information from the repair information register;
(b) merging the persistent repair information with the dynamic repair information to generate merged repair information; and
(c) storing the merged repair information in the repair information register.

18. The circuit arrangement of claim 15, wherein the repair information register comprises a shift register.

19. An integrated circuit device comprising the circuit arrangement of claim 10.

20. The integrated circuit device of claim 19, further comprising a redundant memory array coupled to the dynamic repair circuit.

21. A computer comprising the circuit arrangement of claim 10.

22. A program product, comprising a hardware definition program that defines the circuit arrangement of claim 10; and a signal bearing media bearing the hardware definition program.

* * * * *